(12) United States Patent
Aoki

(10) Patent No.: US 6,281,540 B1
(45) Date of Patent: *Aug. 28, 2001

(54) SEMICONDUCTOR MEMORY DEVICE HAVING BITLINES OF COMMON HEIGHT

(75) Inventor: Masami Aoki, Fishkill, NY (US)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,248

(22) Filed: Feb. 25, 1998

(30) Foreign Application Priority Data

Feb. 28, 1997 (JP) .................................... 9-046810

(51) Int. Cl.[7] .................................................. H01L 27/108
(52) U.S. Cl. .......................................... 257/306; 257/775
(58) Field of Search ...................... 438/254, 241, 438/211, 633, 635, 396, 387, 397, 238, 239, 655, 627; 365/51; 257/306, 309, 303, 775, 763

(56) References Cited

U.S. PATENT DOCUMENTS

| | | | |
|---|---|---|---|
| 5,332,685 | * | 7/1994 | Park et al. ............................ 438/239 |
| 5,561,623 | * | 10/1996 | Ema ........................................ 365/51 |
| 5,591,659 | * | 1/1997 | Ema et al. ............................ 438/241 |
| 5,621,247 | * | 4/1997 | Hirao et al. .......................... 257/763 |
| 5,629,539 | * | 5/1997 | Aoki et al. ............................ 257/306 |
| 5,808,365 | * | 9/1998 | Mori ...................................... 257/775 |
| 5,879,981 | * | 3/1999 | Tanigawa ............................ 438/241 |
| 5,882,535 | * | 3/1999 | Stocks et al. .......................... 216/18 |
| 5,895,947 | * | 4/1999 | Lee et al. ............................ 257/303 |
| 5,998,251 | * | 12/1999 | Wu et al. ............................ 438/241 |

* cited by examiner

Primary Examiner—Olik Chaudhuri
Assistant Examiner—William David Coleman
(74) Attorney, Agent, or Firm—Banner & Witcoff, Ltd.

(57) ABSTRACT

A semiconductor memory device comprises a memory cell region having an array of plurality of memory cells, and a peripheral circuit region to which a bit line connected to a predetermined number of the memory cells in the memory cell region is extended and connected, the bit line in the memory cell region and the bit line in the peripheral circuit region having substantially the same upper surface height.

21 Claims, 8 Drawing Sheets

SEMICONDUCTOR MEMORY DEVICE HAVING BITLINES OF COMMON HEIGHT

BACKGROUND OF THE INVENTION

The present invention relates to a semiconductor memory device and a method of manufacturing the same. More specifically, the present invention relates to a semiconductor device for DRAMs (Dynamic Random Access Memories) which includes a memory cell array and a peripheral circuit mounted together on the same chip.

Nowadays, memory cells (DRAM cells) having a stacked capacitor have been developed for use in a 256M bit DRAM and an IG bit DRAM. In most of the DRAM cells, the capacitor is formed after a bit line is formed. Such a structure is called "capacitor-over-bit-line (COB) structure".

The COB structure has a merit in that the capacitor can occupy a large area since the capacitor is not influenced by the formation of the bit line. However, the COB has demerits in that a parasitic capacitance to the bit line is large, and in that it is difficult to form the bit line by use of Al since a self-aligning process is required for the bit line formation.

Because of the aforementioned demerits, the COB structure is not well adapted to the chip (which will be a main-current DRAM chip) consisting of a memory cell array and a peripheral logic circuit (hereinafter referred to as "peripheral circuit") mounted together on the same chip.

On the other hand, if another cell having a bit-line-over-capacitor structure (a capacitor is formed before the bit line) is employed, the aforementioned problems can be overcome. However, if the chip having a memory cell array and a peripheral circuit mounted together thereon, is formed by using the bit-line-over-capacitor structure, a stepped portion is undesirably formed on an upper surface of an interlayer insulating film between the memory cell region and the peripheral circuit region depending upon the presence/absence of a capacitor.

FIGS. 1A–1C show an example of a DRAM having a memory cell array and a peripheral circuit mounted on the same chip and formed by using a cell having the bit-line-over-capacitor structure. In the DRAM shown in these figures, a memory cell region is shown on the left side (101a) of the device and a peripheral circuit region is shown on the right side (101b).

To describe the DRAM more specifically referring to FIG. 1C, a device formation region is surrounded by a field oxidation film 102 which is formed on a silicon substrate 101. In the device formation region, a plurality of MOS transistors each consisting of a gate electrode 103 and source/drain regions 104, are formed. The memory cell region 101a is thus formed. In the memory cell region, a stacked capacitor is formed. The stacked capacitor is formed of a storage node electrode 105, a capacitor insulating film 106, and a plate electrode 107. The storage node electrode 105 is electrically connected to one of the source/drain regions 104 of each of the MOS transistors.

Corresponding to the other source/drain region 104, a bit line contact 110 is formed which is connected to a bit line 109 formed on an interlayer insulating film 108.

In the peripheral circuit region 101b, a gate electrode contact 111 to be connected to the bit line 109 is formed in correspondence with the gate electrode 103 formed on the field oxidation film 102.

Furthermore, a diffusion layer contact 112 to be connected to the bit line 109 is formed corresponding to one of the source/drain regions 104 of the MOS transistor which is formed on the field region.

However, the DRAM thus constructed has a problem. Since the interlayer insulating film 108 is formed over an entire surface after the stacked capacitor is formed in the memory cell portion, as shown in FIG. 1B, a stepped portion 120 is formed in the upper surface of the interlayer insulating film 108 between the memory cell region 101a and the peripheral circuit region 101b depending upon the presence or absence of the capacitor (see FIG. 1C). It is therefore difficult to pattern the bit line 109 with a high accuracy. As mentioned above, the DRAM of a the bit-line-over-capacitor structure has a problem in that the memory cell region is not well-matched with the peripheral circuit region.

BRIEF SUMMARY OF THE INVENTION

An object of the present invention is to provide a semiconductor memory device including a memory cell region and a peripheral circuit region mounted on the same chip, both being matched excellently without a stepped portion which is usually formed in an upper interlayer insulating film between the memory cell region and the peripheral circuit region depending upon the presence and absence of a capacitor.

To attain the object, the semiconductor memory device according to a first aspect of the present invention comprises:

a memory cell region having an array of a plurality of memory cells; and a peripheral circuit region to which a bit line connected to a predetermined number of the memory cells of the memory cell region is extended and connected;

the bit line in the memory cell region and the bit line in the peripheral circuit region having substantially the same upper surface height.

The semiconductor memory device according to a second aspect of the present invention comprises a semiconductor substrate;

a plurality of MOS transistors respectively formed in a memory cell region and in a peripheral circuit region on the semiconductor substrate, each of the MOS transistors having source/drain regions;

a first interlayer insulating film formed over an entire surface of the semiconductor substrate including the MOS transistors;

a plurality of capacitors formed in a plurality of first contact holes which are formed in the first interlayer insulating film of the memory cell region in such a way that one of the source/drain regions is exposed therein, each of the capacitors being formed at least on an inner wall portion of a corresponding one of the first contact holes and having a storage electrode formed of a first conducting material and a plate electrode formed on the storage electrode with a capacitor insulating film interposed therebetween;

a first plug electrode formed in each of a plurality of second contact holes formed in the first interlayer insulating film of the memory cell region in such a way that the other of the source/drain regions is exposed therein; the first plug electrode being formed by burying a second conducting material in each of the second contact holes interposing a barrier layer of a first conducting material formed at least on an inner wall of each of the second contact holes;

a second plug electrode formed in each of a plurality of third contact holes formed in the first interlayer insulating film of the peripheral circuit region in such a way that either one of the source/drain regions is exposed therein, the second plug electrode being formed by burying the second conducting material in each of the third contact holes interposing a barrier layer of the first conducting material formed at least on an inner wall of each of the third contact holes;

a second interlayer insulating film formed over an entire surface of the first interlayer insulating film;

a first and a second contact electrode respectively formed on the first and the second plug electrode, in a fourth and a fifth contact hole formed in the second interlayer insulating film in such a way that the first and the second plug electrode are exposed therein, respectively; and a plurality of bit lines respectively connected to the first and the second contact electrode, and formed on the second interlayer insulating film.

The method of manufacturing a semiconductor memory device according to a third aspect of the present invention comprises the steps of:

forming MOS transistors both in a memory cell region and in a peripheral circuit region formed on a semiconductor substrate;

forming an interlayer insulating film over an entire surface of the semiconductor substrate including the MOS transistors; and forming a barrier layer of a bit line connecting portion and a storage electrode of a capacitor by use of the same conducting material simultaneously in the interlayer insulating film.

The method of manufacturing a semiconductor memory device according to a fourth aspect of the present invention comprises the steps of:

forming MOS transistors both in a memory cell region and in a peripheral circuit region formed on a semiconductor substrate;

forming a first interlayer insulating film over an entire surface of the semiconductor substrate after the step of forming the MOS transistors;

flattening a surface of the first interlayer insulating film;

removing the first interlayer insulating film selectively to form a contact hole for a storage electrode and contact holes for a first and a second plug electrode;

forming a storage electrode and a barrier layer by use of a first conducting material at least on inner walls of the contact holes for the first and the second plug electrode, respectively;

burying a dummy film in the contact holes for the first and the second plug electrode;

removing the dummy film buried in the contact holes for the first and the second plug electrode other than the dummy film buried in the contact hole for the storage electrode;

forming the first and the second plug electrode by burying a second conducting material in the contact holes for the first and the second plug electrode from which the dummy film is removed;

removing the dummy film buried in the contact hole for the storage electrode;

forming a capacitor insulating film along an surface of the storage electrode;

forming a capacitor by providing a plate electrode in the contact hole for the storage electrode interposing the capacitor insulating film;

forming a second interlayer insulating film over an entire surface of the substrate;

flattening an surface of the interlayer insulating film;

removing the second interlayer insulating film selectively to form contact holes for a first and a second contact electrode to be connected to the first and the second plug electrode, respectively; and forming a bit line on the second interlayer insulating film simultaneously with the first and the second contact electrode which connect the bit line to the first and the second plug electrode.

According to the semiconductor memory device and the method of manufacturing the semiconductor memory device of the present invention, the process for forming the memory cell region having a stacked capacitor of a bit-line on capacitor structure can be easily matched with the process for forming the peripheral circuit region. By virtue of this, it is possible to improve the fine-patterning processability of the DRAM which consists of the memory cell region and the peripheral circuit region mounted on the same chip, without performing a particular flattening step of the interlayer insulating film.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.
(First embodiment)

Figure 1A:
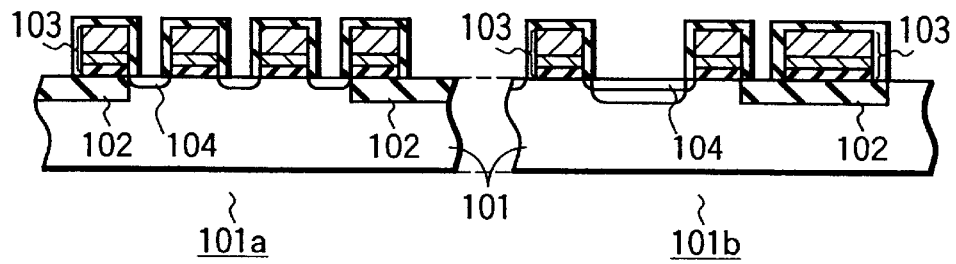
FIGS. 1A–1C are schematic sectional views of a conventional DRAM for explaining a manufacturing process thereof and accompanying problems.
Figure 1B:
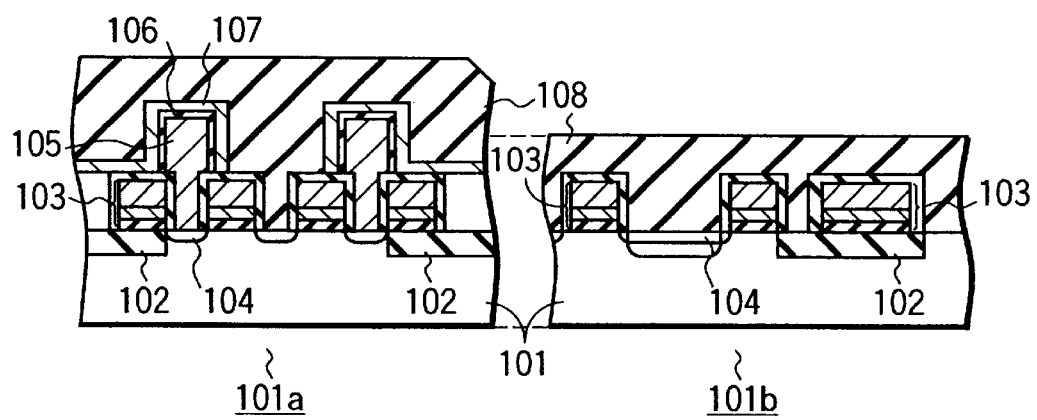
Figure 1C:
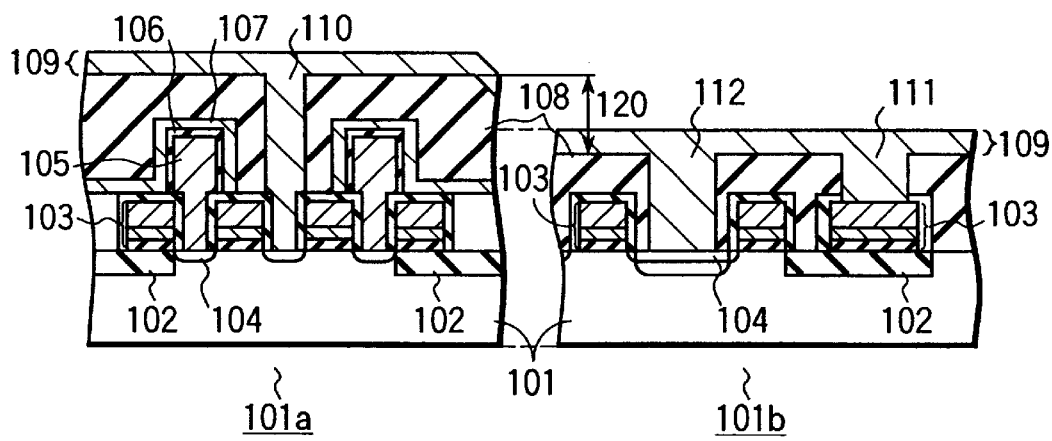
Figure 2A:
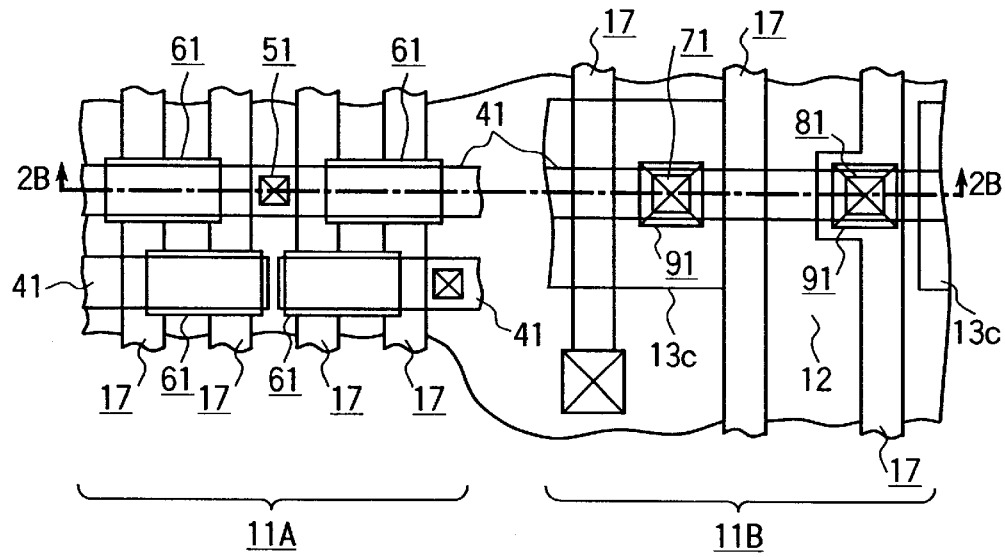
FIG. 2A is a schematic plan view of a gist portion of a DRAM according to a first embodiment of the present invention having a memory cell region of a bit-line-over-capacitor structure and a peripheral circuit region mounted on the same chip.
Figure 2B:
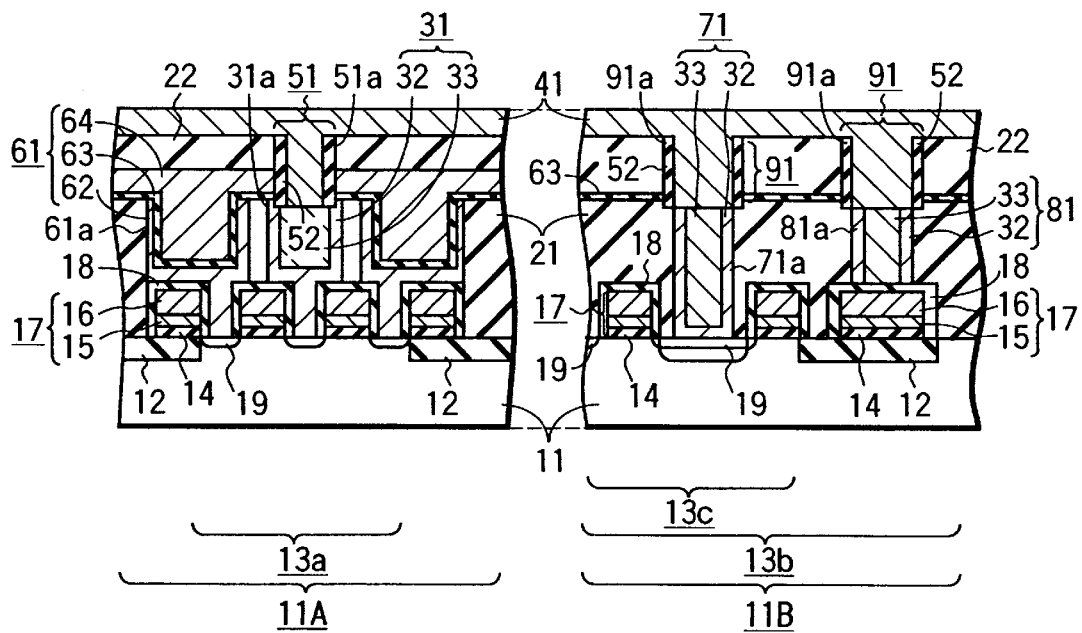
FIG. 2B is a cross sectional view of the DRAM taken along a line 2B—2B of FIG. 2A.

FIGS. 2A and 2B show schematic structures of a DRAM according to a first embodiment of the present invention, which is characterized by having a memory cell region and a peripheral circuit region mounted on the same chip. More precisely, FIG. 2A is a plan view of a gist portion of the DRAM, showing its layout (½ pitch, $8F^2$(F represents a minimum design rule)). FIG. 2B is a cross sectional view of a gist portion of the DRAM taken along a line 2B—2B of FIG. 2A. The memory cell region is shown on the left side (11A) and the peripheral circuit region is shown on the right side (11B) of FIG. 2B.

The DRAM includes the memory cell region (DRAM cell) 11A having a stacked capacitor of the bit-on-capacitor structure and the peripheral circuit (logic circuit) region 11B mounted together on a chip formed of a P-type silicon substrate (semiconductor substrate) 11, as shown in FIG. 2B.

More precisely, as shown in FIG. 2B, in the memory cell region 11A, the field oxidation film 12 (device isolation film) is formed selectively in the surface of the P-type silicon substrate 11. Gate electrodes 17 are selectively formed on a memory cell region 13a surrounded by the field oxidation film 12 with a gate oxidation film 14 interposed therebetween. Each of the gate electrodes 17 is formed by stacking polycrystalline silicon 15 and an electrode material 16 such as tungsten polycide or titanium silicide.

On the upper portion and side portions of each gate electrode 17, a silicon nitride film 18 is formed.

In the surface of the p-type silicon substrate 11 between gate electrodes 17, source/drain regions 19 are formed of an $N^{hu\ -}$ type diffusion layer. In this way, a plurality of N-type MOS transistors are constructed.

On the entire surface of the p-type silicon substrate 11 including the surfaces of the MOS transistors, a first interlayer insulating film 21 made of $SiO_2$ (silicon oxide) is formed, as shown in FIG. 2B.

In the first interlayer insulating film 21, a bit line plug (a first plug electrode) 31 constituting the bit line connecting portion is formed corresponding to one (drain) of the source/drain regions 19 of the MOS transistor.

The bit line plug 31 is formed of a barrier layer 32 formed along an inner wall of, for example, the first plug electrode contact hole 31a and a second conducting material 33 buried in a space surrounded by the barrier layer 32. The barrier layer is a stacked film of Ti(titanium)—TiN(titanium nitride) (first conducting material). As the second conducting material 33, for example, W is used.

On the bit line plug 31, a bit line contact (first contact electrode) 51 is formed for connecting the bit line 41, as shown in FIGS. 2A and 2B. The bit line connecting portion is constituted of the bit line contact 51 and the bit line plug 31.

The bit line contact 51 is constituted of an insulating film 52 formed along an inner wall of the first contact electrode contact hole 51a and a wiring material buried in the space surrounded by the insulating film 52. The insulating film 52 is formed of SiN (silicon nitride). As the wiring material, for example, W (tungsten), aluminium (Al) or copper (Cu) which is used for the bit line 41, is employed.

In the portion of the first interlayer insulating film 21 corresponding to the other (source) of the source/drain regions 19 of the MOS transistor, a capacitor 61 is formed as shown in FIG. 2B.

The capacitor 61 consists of a storage electrode 62 and a plate electrode 64 which is buried in the storage electrode 62 with a capacitor insulating film ($Ta_2O_5$ (tantal oxide) film) 63 interposed therebetween. The storage electrode 62 is a stacked film of Ti and TiN (first conducting material) formed along an inner wall of a storage electrode contact hole 61a. Note that the capacitor insulating film may be an NO film or an ONO film.

A second interlayer insulating film 22 ($SiO_2$) is formed on the plate electrode 64. A bit line 41 is formed of the wiring material (such as W or an Al alloy) on the second interlayer insulating film 22.

On the other hand, as shown in the peripheral circuit region 11B (13b) of the FIG. 2B, a gate electrode 17 is selectively formed not only on the field oxidation film 12 (selectively formed on the surface of the P-type silicon substrate 11) but also in the field region 13c excluding the field oxidation film 12, with the gate oxidation film 14 interposed therebetween. The gate electrode 17 is a stacked film formed of the polycrystalline silicon 15 and the electrode material 16.

On the upper portion and side portions of the gate electrode 17, the silicon nitride film 18 is formed.

The source/drain regions 19 are formed of an $N^-$ type diffusion layer in the surface of the p-type silicon substrate 11 on both sides of each of gate electrodes 17. In this manner, a plurality of N-type MOS transistors are formed.

Over the entire surface of the P-type silicon substrate 11 including the surfaces of the MOS transistors, the first interlayer insulating film 21 ($SiO_2$) is formed, as shown in FIG. 2B.

In the first interlayer insulating film 21, a diffusion layer plug (second plug electrode) 71 is formed which constitutes a bit-line connecting portion (a first peripheral contact) to be connected to the bit line 41 in correspondence with one (drain) of the source/drain regions 19 of the MOS transistor.

The diffusion layer plug 71 is formed of the barrier layer 32 formed along an inner wall of the second plug electrode contact hole 71a, and a second conducting material 33 (such as W) buried in the space surrounded by the barrier layer 32, as shown in FIG. 2B. The barrier layer 32 is formed of a stacked film formed of Ti—TiN (the first conducting material).

On the gate electrode 17 formed on the field oxidation film 12, a gate electrode plug (second plug electrode) 81 is formed as shown in FIG. 2B. The gate electrode plug constitutes a bit line connecting portion (a second peripheral contact).

The gate electrode plug 81 is formed of the barrier layer 32 formed along an inner wall of the second plug electrode contact hole 81a and the second conducting material 33 (such as W) buried in the space surrounded by the barrier layer 32. The barrier layer 32 is formed of a stacked film formed of Ti—TiN (the first conducting material).

On the diffusion layer plug 71 and the gate electrode plug 81, a bit line contact (second contact electrode) 91 to be connected to the bit line 41 is formed, as shown in FIGS. 2A and 2B. The bit line connecting portion is formed of either the bit line contact 91 in combination with the diffusion layer plug 71 or the bit line contact 91 in combination with the gate electrode plug 81.

The bit line contact 91, as shown in FIG. 2B, is formed of a SiN insulating film 52 formed along the inner wall of the second contact electrode contact hole 91a and a wiring material buried in a space surrounded by the SiN insulating film 52.

The second contact electrode contact hole 91a is formed through the $Ta_2O_5$ film 63 and the second interlayer insulating film 22. As the wiring material, for example, W or an Al alloy (which is also used for the bit line 41) is used.

In the DRAM thus constituted, the bit line connecting portion in the memory cell region 11A has the same surface height as that of the peripheral circuit region 11B. Because of these features, when the memory cell region 11A and the peripheral circuit region 11B are mounted on the same chip, the formation process for the memory cell region 11A can be more accurately matched with that for the peripheral circuit region 11B.

To explain more specifically, in the memory cell region 11A having a stacked capacitor of the bit-line-on capacitor structure, the formation of the bit line plug 31 is made simultaneously with the formation of the each of the plugs 71 and 81 of the peripheral circuit region. In addition, the formation of the bit line contact 51 is made simultaneously with the formation of the bit line contacts 91, 91 of the peripheral circuit region.

As mentioned above, the memory cell region (11A) formation process can be easily matched with the peripheral circuit (11B) formation process.

Hence, when the second interlayer insulating film 22 is deposited, the stepped portion (which is usually caused by the presence of the capacitor 61) is not formed on the upper surface of the second interlayer insulating film 22 between the memory cell region 11A and the peripheral circuit region 11B. As a result, processing can be applied onto the flat surface, improving an processing accuracy when the bit line 41 is patterned.

In addition, the barrier layer 32 of each of plugs 31, 71, and 81 can be formed simultaneously with the storage node electrode 62 of the capacitor 61 after the first interlayer insulating film 21 is deposited. As a result, steps for forming the capacitor 61 can be reduced in number drastically.

After the transistor is formed, in particular, a full metal process can be employed. To explain more specifically, a DRAM consisting of the memory cell region 11A having a stacked capacitor of the bit-line-over-capacitor structure and the peripheral circuit region 11B mounted on the same chip, can be easily manufactured at a low cost simply by adding steps of forming the capacitor insulating film 63 and the plate electrode 64 to the process for manufacturing a standard logic LSI.

Next, we will explain a process for manufacturing the DRAM having the aforementioned structure.

Figure 3:
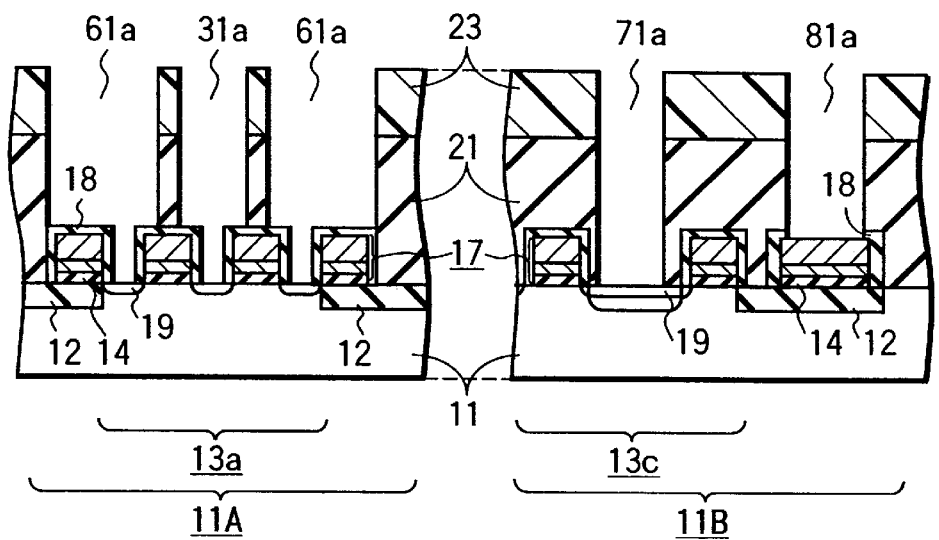
FIGS. 3–11 are schematic sectional views of the DRAM for explaining a method of manufacturing the DRAM according to the first embodiment, stepwise.

As shown in FIG. 3, the field oxidation films 12 are selectively formed on the surface of the P-type silicon substrate 11. Thereafter, the gate electrodes 17 are formed on the substrate 11 with the gate oxidation film 14 interposed therebetween. At the same time, the source/drain regions 19 are separately formed in spaces between the gate electrodes 17 in regions 13a and 13c. In this way, a plurality of N-type MOS transistors are formed.

A nitride silicon film 18 is then formed on the upper portion and side portions of each of the gate electrodes 17. Thereafter, the first interlayer insulating film 21 ($SiO_2$) is formed in a thickness of about 300 to 1000 nm over the entire surface by a CVD method and flattened by a CMP (Chemical Mechanical Polishing) method.

Subsequently, a resist mask 23 is formed on the first interlayer insulating film 21. The contact holes 31a, 61a, 71a and 81a are successively or simultaneously formed.

To explain more specifically, in the memory cell 11A, a contact hole (first plug electrode contact hole) 31a for forming the bit line plug 31 and a contact hole (storage electrode contact hole) 61 for forming the capacitor 61 are separately formed through the first interlayer insulating film 21.

On the other hand, in the peripheral circuit region 11B, contact holes (second plug electrode contact holes) 71a and 81a for forming the diffusion layer plug 71 and the gate electrode plug 81, respectively, are formed.

Figure 4:
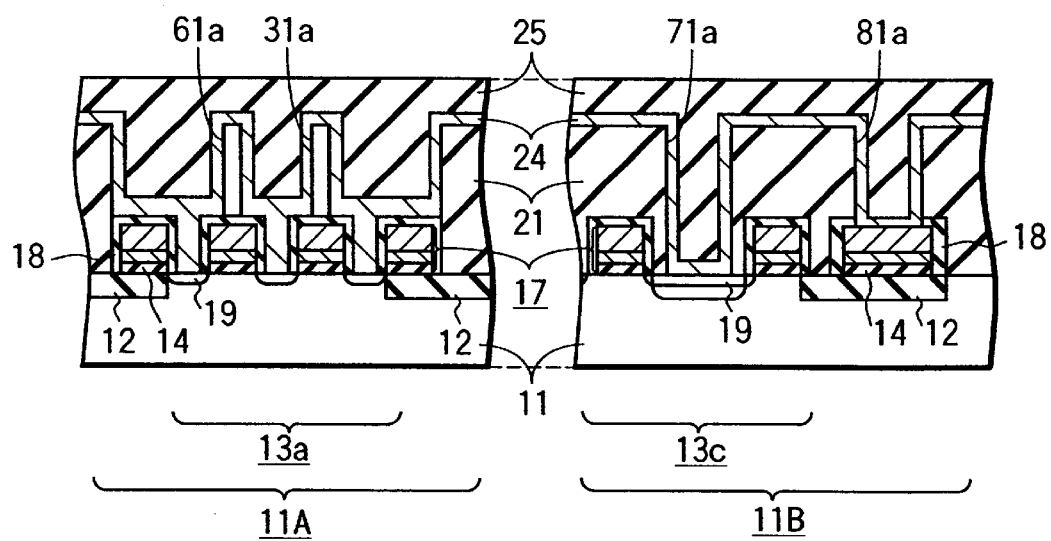

After the resist mask 23 is removed, as shown in FIG. 4, a Ti—TiN stacked film (first conducting material) 24 is deposited in a thickness of about 10 to 50 nm on the bottom and side portions of contact holes 31a, 61a, 71a, and 81a to form the barrier layer 32 or the storage electrode 62.

A dummy insulating film 25 is then deposited over the entire surface so as to fill the contact holes 31a, 61a, 71a, and 81a. As the dummy insulating film 25, a PSG (phosphosilicate glass) film, a BPSG (boron-doped phospho silicate glass) film, or the like is used.

Figure 5:
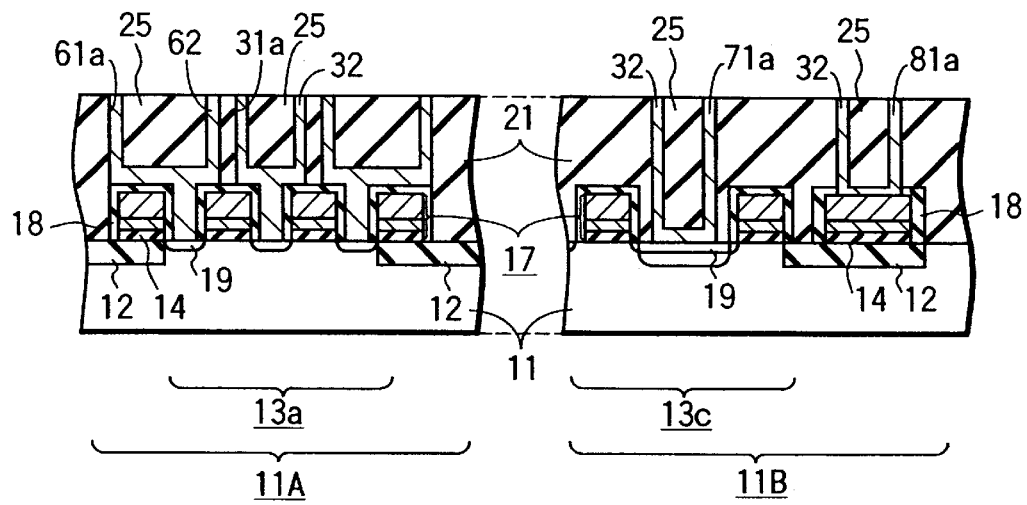

The upper surface of the dummy insulating film 25 is then flattened by a CMP method, as shown in FIG. 5. Subsequently, the laminate film 24 present on the first interlayer insulating film 21 is removed by etchback.

Since the dummy insulating film 25 is buried in the contact holes 31a, 61a, 71a and 81a, adverse effects such as a polishing-agent deposition in the holes can be avoided during the etchback.

In this process, the contact holes 31a, 71a and 81a are filled with the barrier layer 32 and the dummy insulating film 25. The contact hole 61a is filled with the storage node electrode 62 and the dummy insulating film 25.

Figure 6:
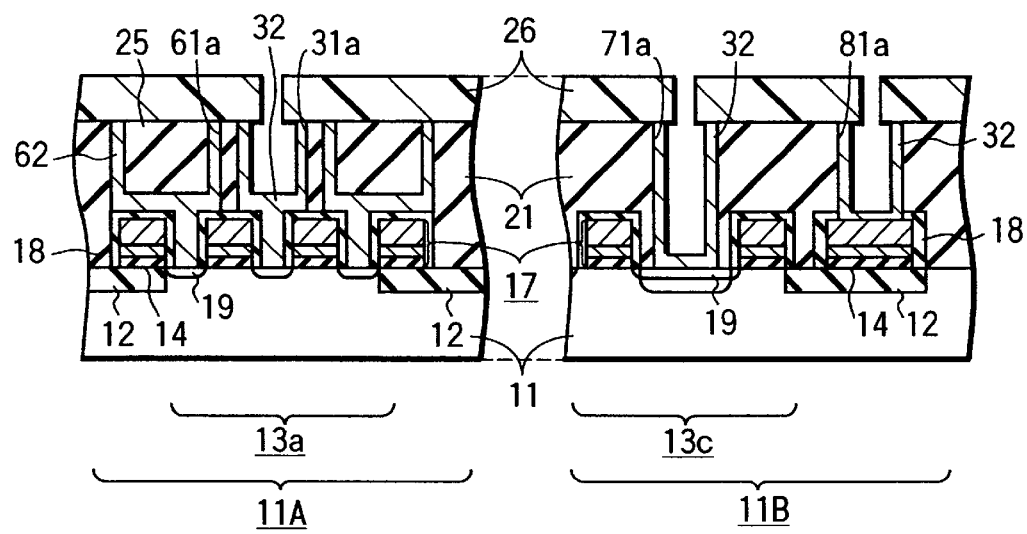

As shown in FIG. 6, the dummy insulating film 25 buried in the contact hole 31a (for the bit line plug 31), 71a (for the diffusion layer plug 71), and 81a (for the gate electrode plug 81) is removed by etching using the resist mask 26. As the etching means used herein, a gaseous etching or liquid etching is preferably employed. Isotropic etching is particularly preferably employed.

Figure 7:
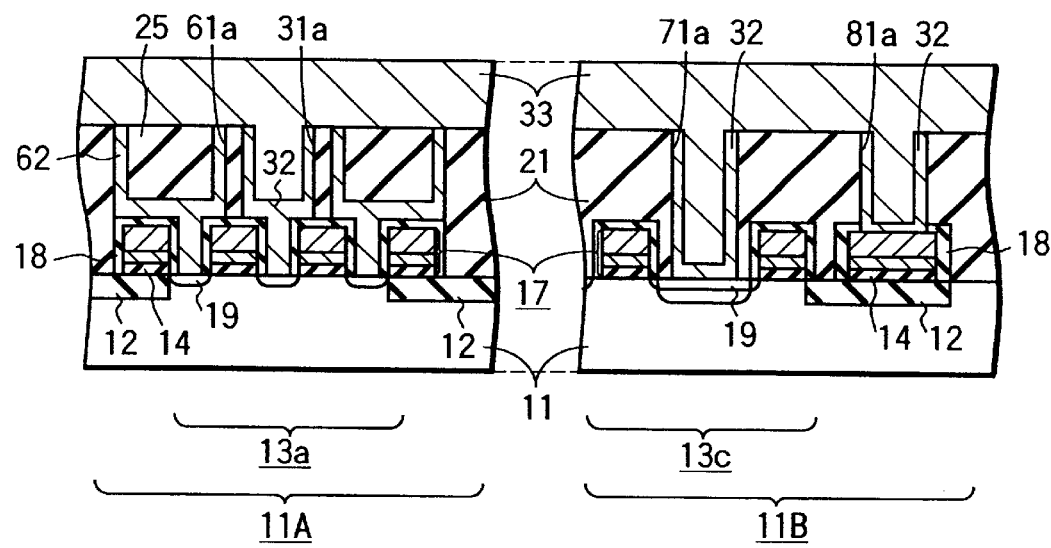

Subsequently, as shown in FIG. 7, after the resist mask 26 is removed, the second conducting material 33 (W) is deposited over the entire surface by a CVD method, followed by etching back by a CMP method while keeping its flatness. As a result, the second conducting material 33 is left only in the contact holes 31a, 71a and 81a, forming the bit line plug 31, the diffusion layer plug 71 and gate electrode plug 81, separately.

Figure 8:
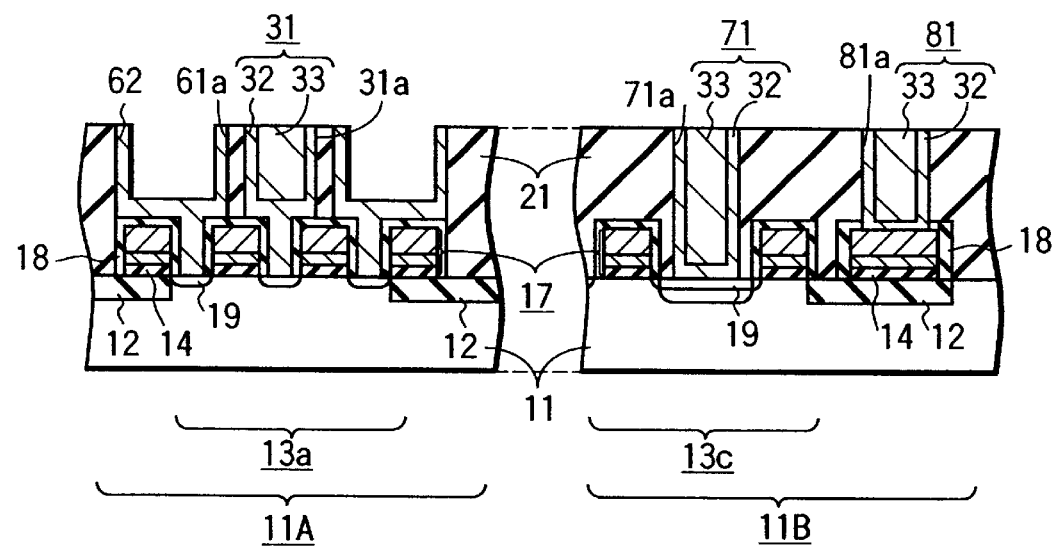

Thereafter, as shown in FIG. 8, the dummy insulating film 25 buried in the contact hole 61a (for the capacitor 61) is removed by etching using a resist mask (not shown), in the same manner as mentioned above.

Figure 9:
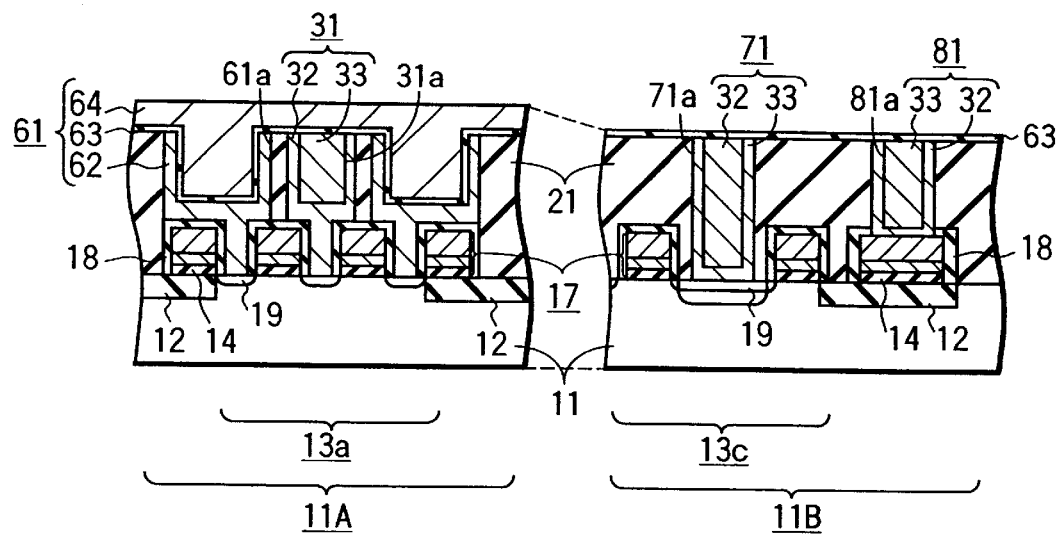

As shown in FIG. 9, after the resist mask is removed, the capacitor insulating film 63 (e.g, $Ta_2O_5$) is formed in a thickness of about 5 to 25 angstroms {in terms of an oxide film} over the entire surface. Then, the plate electrode 64 (such as W) is deposited on the $Ta_2O_5$ film 63 to fill only the contact hole 61a. In this way, the capacitor 61 is formed.

Figure 10:
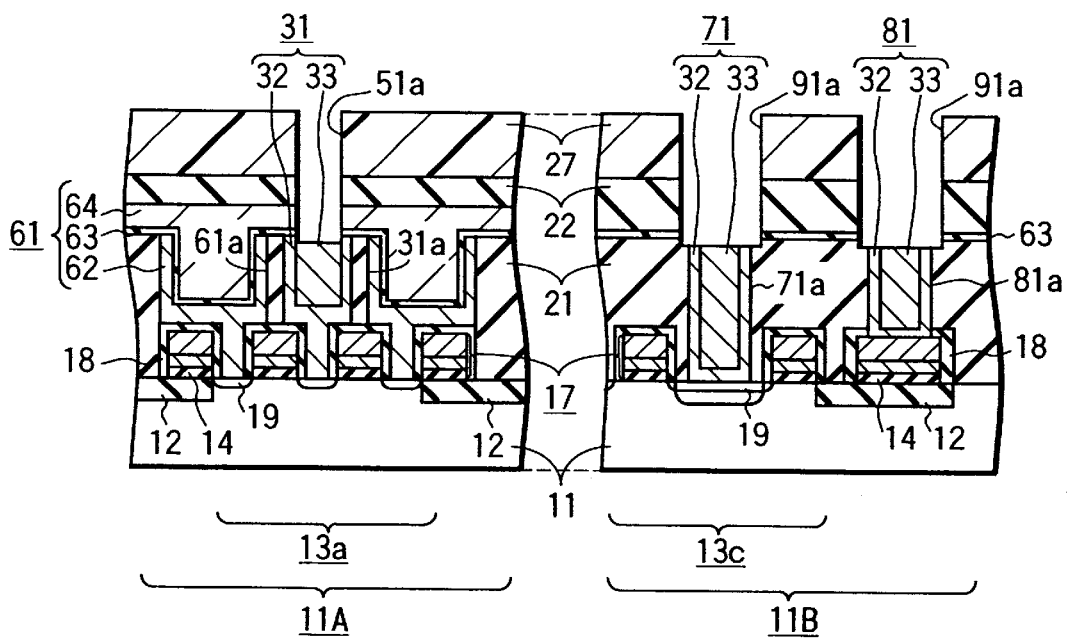

Subsequently, as shown in FIG. 10, after the second interlayer insulating film 22 is formed over the entire surface, contact holes 51a, 91a and 91a (serving as the first and second contact electrode contact holes) are separately formed by use of a resist mask 27 to form the bit line contacts 51, 91 and 91.

Figure 11:
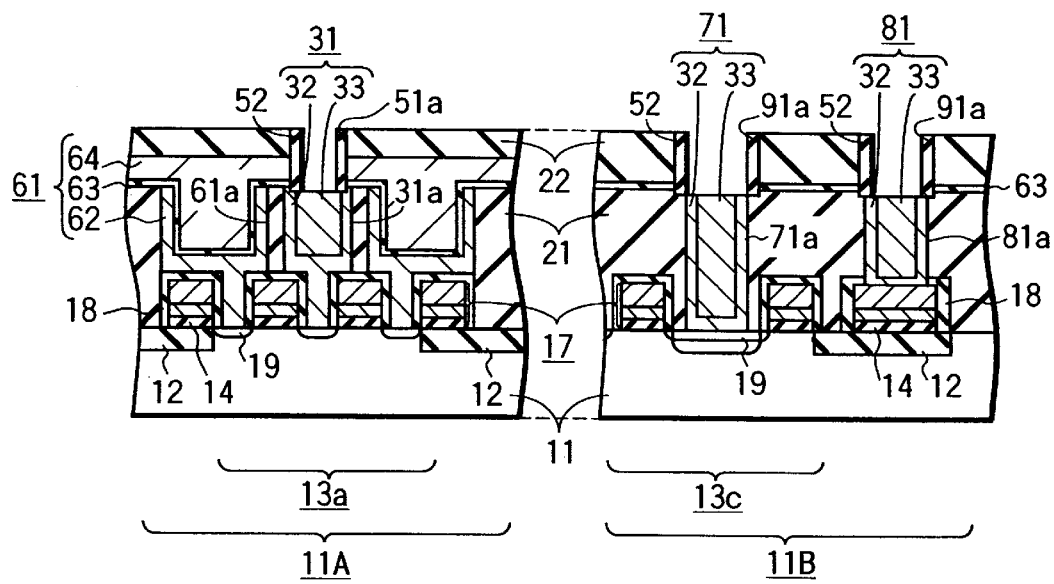

After the resist film 27 is removed as shown in FIG. 11, for example, SiN is deposited over the entire surface in a thickness of about 10 to 50 nm, and etched by RIE in such a way that the SiN film remains on side walls of each of the contact holes. In this manner, an insulating film 52 is formed.

Afterward, a wiring material (such as W or an Al alloy) is deposited on the second interlayer insulating film 22 and patterned.

In the aforementioned steps, the formation of the bit line contacts 51, 91 and 91 having the wiring material buried in each of contact holes 51a, 91a and 91a, and the formation of the bit line 41 to be connected to the bit line contacts 51, 91 and 91 are completed. As a result, the DRAM is accomplished including the memory cell region 11A and the peripheral circuit region 11B mounted together on the same chip, as shown in FIGS. 2A and 2B.

As mentioned above, the bit line connecting portion in the memory cell region has the same surface height and the same construction as those of the bit line connecting portion in the peripheral circuit region.

By virtue of this, each bit line plug and bit line contact in the memory cell region and the peripheral circuit region can be formed simultaneously in the same process. Hence, a full metal process for forming the bit line of Al can be employed. In this way, the process for manufacturing the memory cell region having a stacked capacitor of the bit-line-over-capacitor structure can be matched with the process for manufacturing the peripheral circuit formation. Hence, in the case where the memory cell region and the peripheral circuit region are mounted on the same chip, the memory cell region can be easily matched with the peripheral circuit region. As a result, no stepped portion is formed on the upper surface of the interlayer insulating film regardless the presence or absence of a capacitor.

In particular, if the height of the storage electrode is increased to obtain a requisite storage capacitance, the height of the upper surface of the plug is accordingly increased. As a result, processing can be always applied to a flat surface. Hence, a micro patterning required for a bit line patterning can be made more accurately without a particular flattening step.

The storage electrode of the capacitor is formed simultaneously with the barrier layer of each plug. The first conducting material for use in forming the barrier layer may be used in forming the storage electrode of a capacitor. Accordingly, the number of the steps for forming the capacitor can be reduced drastically.

According to the DRAM constructed in the above, since an MIM (metal-insulator-metal) type capacitor can be formed easily, the performance of the capacitor insulating film can be fully presented.

In this embodiment, the bit line 41 in the peripheral circuit region is described as the bit line extended from the memory cell region, as an example. It is noted that the bit line 41 in the peripheral circuit region includes wires formed in the same wiring layer as the bit line 41 formed in the memory cell region.

(Second Embodiment)

Figure 12:
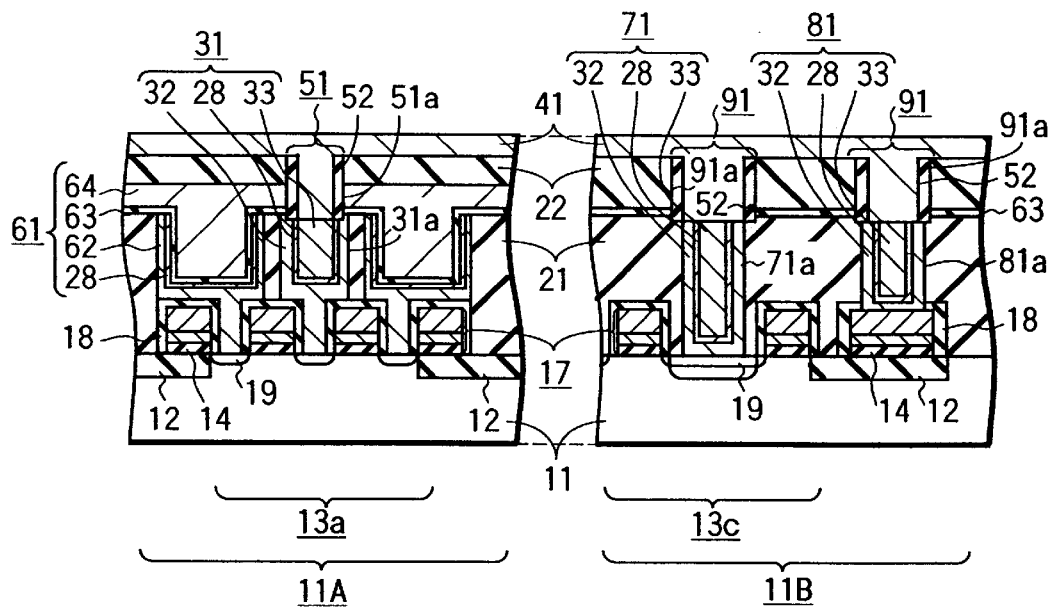
FIG. 12 is a schematic sectional view of a gist portion of a DRAM according to a second embodiment of the present invention.

The first embodiment of the present invention has been explained taking the case as an example, in which the capacitor insulating film ($Ta_2O_5$) 63 is formed on the storage node electrode 62. However, the present invention is not limited to this case. For example, a film 28 of Pt (platinum), Ru (ruthenium), or $RuO_2$ (ruthenium oxide) may be further layered at least on the storage electrode 62, as shown in FIG. 12.

The film 28 is easily formed by depositing the laminate film 24, the film 28, and the dummy insulating film 25 on the entire surface in the order mentioned and removing them in such a way that they remain only in the contact holes 31*a*, 61*a*, 71*a*, and 81*a*.

In the DRAM of this type, a film, such as a BSTO ($Ba_xSr_{1-x}TiO_3$ (barium strontium titanate) film having a dielectric constant higher than that of the $Ta_2O_5$ film 63, may be used as the capacitor insulating film.

(Third embodiment)

Figure 13:
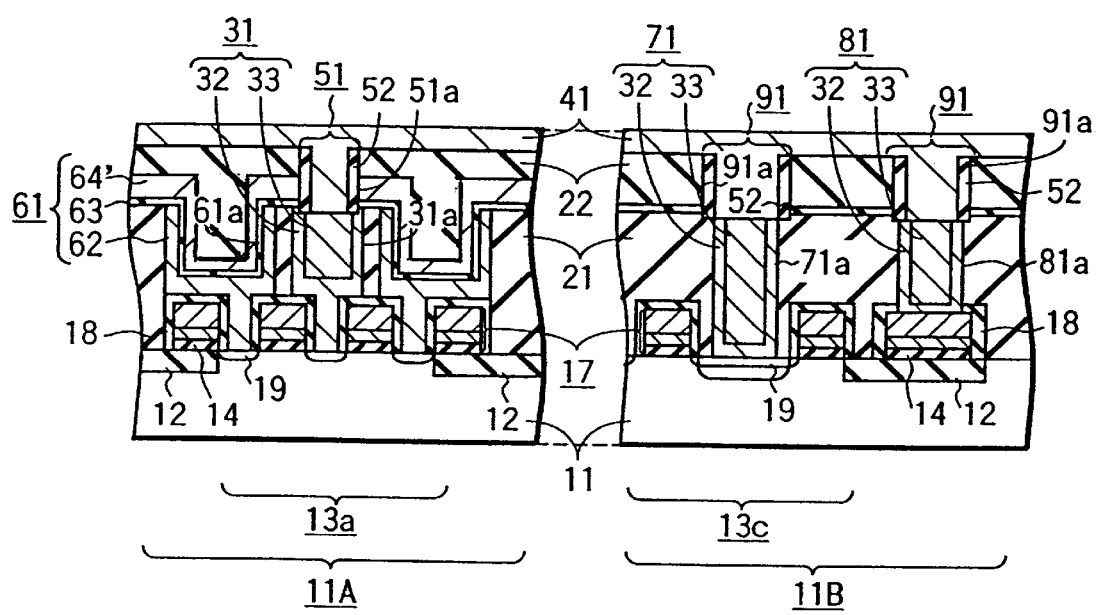
FIG. 13 is a schematic sectional view of a gist portion of a DRAM according to a third embodiment of the present invention.

Other than the case where the storage electrode contact hole 61*a* is filled up with the plate electrode 64 interposing the capacitor insulating film ($Ta_2O_5$) 63, the plate electrode 64' may be provided only along the $Ta_2O_5$ film 63, as shown in FIG. 13.

In the DRAM thus constructed, if the plate electrode 64' is formed thin, the parasitic capacitance of the contact portion can be further reduced.

In the DRAM according to the third embodiment of the present invention, the film 28 (Pt, Ru, $RuO_2$ or the like) may be interposed at least between the storage node electrode 62 and the capacitor insulating film, and the BSTO film may be employed as the capacitor insulating film, in the same manner as in the second embodiment.

The present invention can be applied not only to the case where the storage electrode 62 is formed in the storage electrode contact hole 61*a* but also the case where at least an upper portion of the capacitor is formed cylindrically. Furthermore, individual material, film thickness, conducting type may be appropriately modified.

As detailed in the foregoing, the present invention can provide a semiconductor memory device having the memory cell region and the peripheral circuit region excellently matched without forming a stepped portion on the upper surface of the interlayer insulating film, regardless the presence or absence of a capacitor, in the case where the memory cell region and the peripheral circuit region are mounted together on the same chip. At the same time, the method of manufacturing such a semiconductor device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor memory device comprising:
   a memory cell region having an array of memory cells formed on a first surface region of a semiconductor substrate; and
   a peripheral circuit region to which a bit line connected to a predetermined number of the memory cells in the memory cell region is extended and connected, the peripheral circuit region being formed on a second surface region other than the first surface region, of the semiconductor substrate,
   the bit line in the memory cell region and the bit line in the peripheral circuit region having substantially the same upper electrode height.

2. The semiconductor memory device according to claim 1, further comprising plug electrodes through which the bit line is connected to the memory cell region and the peripheral circuit region, the plug electrodes being electrically connected respectively to the memory cell region and the peripheral circuit region each via a barrier layer formed of a first conducting material.

3. The semiconductor memory device according to claim 2, further comprising contact electrodes respectively interposed between the plug electrodes and the bit line, a periphery of each of the contact electrodes being covered with SiN.

4. The semiconductor memory device according to claim 2, wherein the memory cell region has a plurality of capacitors each having a storage electrode, a plate electrode, and a capacitor insulating film interposed therebetween, the capacitor insulating film being extending to the peripheral circuit region.

5. The semiconductor memory device according to claim 2, wherein the memory cell region has a plurality of MOS transistors and an insulating film formed on the MOS transistors, and the barrier layer is formed of the first conducting material along an inner wall of a contact hole formed in the insulating film.

6. The semiconductor memory device according to claim 2, wherein one of the plug electrodes is formed of the barrier layer and a second conducting material buried in the contact hole with the barrier layer interposed therebetween.

7. The semiconductor memory device according to claim 6, further comprising contact electrodes formed on each space between the plug electrodes and bit line.

8. A semiconductor memory device comprising:
   a semiconductor substrate;
   a plurality of MOS transistors respectively formed in a memory cell region and in a peripheral circuit region the semiconductor substrate, each of the MOS transistors having one of a source and drain regions;
   a first interlayer insulating film formed over an entire surface of the semiconductor substrate including the MOS transistors;
   a plurality of capacitors formed in a plurality of first contact holes which are formed in the first interlayer insulating film of the memory cell region in such a way that one of the source and drain regions is exposed therein, each of the capacitors being formed at least on an inner wall portion of a corresponding one of the first contact holes and having a storage electrode formed of a first conducting material and a plate electrode formed on the storage electrode with a capacitor insulating film interposed therebetween;
   a first plug electrode formed in each of a plurality of second contact holes formed in the first interlayer insulating film of the memory cell region in such a way that the other of the one of source and drain regions is exposed therein, the first plug electrode being formed by burying a second conducting material in each of the second contact holes interposing a barrier layer of the first conducting material formed at least on an inner wall of each of the second contact holes;
   a second plug electrode formed in each of a plurality of third contact holes formed in the first interlayer insulating film of the peripheral circuit region in such a way that either one of the one of a source and drain regions is exposed therein, the second plug electrode being formed by burying the second conducting material in each of the third contact holes interposing the barrier layer of the first conducting material formed at least on an inner wall of each of the third contact holes;
   a second interlayer insulating film formed over an entire surface of the first interlayer insulating film;
   a first and a second contact electrode respectively formed on the first and the second plug electrode, in a fourth and a fifth contact hole formed in the second interlayer insulating film in such a way that the first and the second plug electrode are exposed therein, respectively; and
   a plurality of bit lines respectively connected to the first and the second contact electrode, formed on the second interlayer insulating film.

9. The semiconductor memory device according to claim 8, wherein a bit line connecting portion in the peripheral circuit region is formed of the second plug electrode and the second contact electrode.

10. The semiconductor memory device according to claim 8, wherein the plate electrode is formed only along an surface of the capacitor insulating film.

11. The semiconductor memory device according to claim 8, wherein each of the fourth and the fifth contact hole has a side-wall insulating film formed on an inner wall thereof.

12. The semiconductor memory device according to claim 4, wherein the storage electrode is made of a first material.

13. The semiconductor memory device according to claim 8, wherein a top end of the storage electrode is formed substantially at the same level as those of the first and the second plug electrode.

14. The semiconductor memory device according to claim 8, a surface of the second interlayer insulating film has substantially the same level both on the memory cell region and on the periphery circuit region.

15. The semiconductor memory device according to claim 8, a top surface of the bit line has substantially the same level both on the memory cell region and on the periphery circuit region.

16. A semiconductor memory device comprising:
   a memory cell region having an array of memory cells;
   a peripheral circuit region to which a bit line connected to a predetermined number the memory cells in the memory cell region is extended horizontally and connected; and
   plug electrodes made of a second conducting material, through which the bit line is connected to the memory cell region and the peripheral circuit region, the plug electrodes being electrically connected respectively to the memory cell region and the peripheral circuit region each via a barrier layer formed of a first conducting material,
   wherein the memory cell region has a plurality of capacitors formed in an insulating layer, each having a storage electrode, a plate electrode, and a capacitor insulating film interposed therebetween, and
   the storage electrode is formed in a contact hole formed in the insulating film and formed of the first conducting material.

17. The semiconductor memory device according to claim 16, further comprising contact electrodes respectively interposed between the plug electrodes and the bit line, a periphery of each of the contact electrodes being covered with SiN.

18. A semiconductor memory device comprising:
   a semiconductor substrate;
   a plurality of MOS transistors respectively formed in a memory cell region and in a peripheral circuit region on the semiconductor substrate, each of the MOS transistors having source/drain regions;
   a first interlayer insulating film formed over an entire surface of the semiconductor substrate including the MOS transistors;
   a plurality of capacitors formed in a plurality of first contact holes which are formed in the first interlayer insulating film of the memory cell region in such a way that one of the source/drain regions is exposed therein, each of the capacitors being formed at least on an inner wall portion of a corresponding one of the first contact holes and having a storage electrode and a plate electrode formed on the storage electrode with a capacitor insulating film interposed therebetween;
   a first plug electrode formed in each of a plurality of second contact holes formed in the first interlayer insulating film of the memory cell region in such a way that the other of the source/drain regions is exposed therein, the first plug electrode being formed by burying a second conducting material in each of the second contact holes interposing a barrier layer of the first conducting material formed at least on an inner wall of each of the second contact holes;

a second plug electrode formed in each of a plurality of third contact holed formed in the first interlayer insulating film of the peripheral circuit region in such a way that either one of the source/drain regions is exposed therein, the second plug electrode being formed by burying the second conducting material in each of the third contact holes interposing the barrier layer of a first conducting material formed at least on an inner wall of each of the third contact holes;

a second interlayer insulating film formed over an entire surface of the first interlayer insulating film; a first and a second contact electrode respectively formed on the first and the second plug electrode, in a fourth and fifth contact hole formed in the second interlayer insulating film in such a way that the first plug electrode and the second plug electrode are exposed therein, respectively; and a plurality of bit lines respectively connected to the first and the second contact electrode, formed on the second interlayer insulating film.

19. The semiconductor memory device according to claim 18, wherein a top end of the storage electrode is formed substantially at the same level as those of the first and the second plug electrode.

20. The semiconductor memory device according to claim 18, an upper surface of the second interlayer insulating film has substantially the same level both on the memory cell region and on the periphery circuit region.

21. The semiconductor memory device according to claim 18, an upper surface of the bit line has substantially the same level both on the memory cell region and on the periphery circuit region.

* * * * *

UNITED STATES PATENT AND TRADEMARK OFFICE
CERTIFICATE OF CORRECTION

PATENT NO.    : 6,281,540 B1
DATED         : August 28, 2001
INVENTOR(S)   : Masami Aoki It is certified that error appears in the above-identified patent and that said Letters Patent is hereby corrected as shown below:

<u>Column 12,</u>
Line 18, -- of -- has been inserted after the word "number".

Signed and Sealed this

Twenty-fourth Day of September, 2002

Attest:

Attesting Officer

JAMES E. ROGAN
*Director of the United States Patent and Trademark Office*